Figure 1:
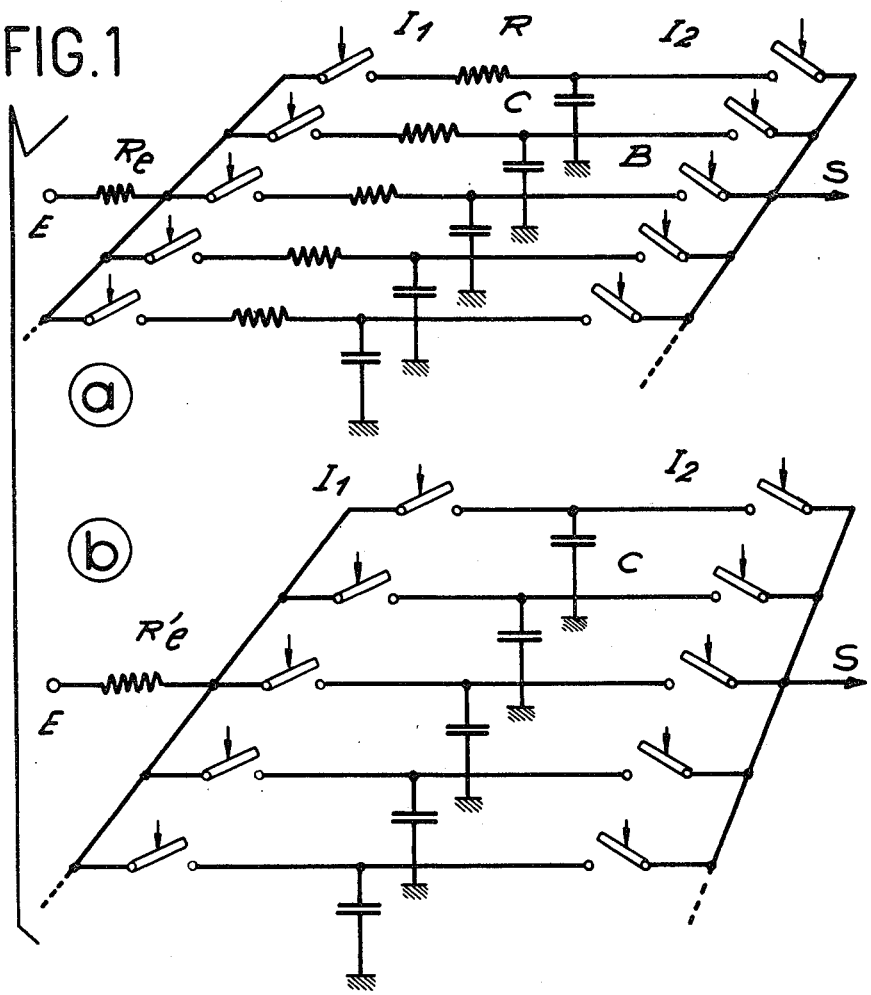

United States Patent [19]

Gignoux

[11] 4,378,538

[45] Mar. 29, 1983

[54] ASSEMBLY FOR FILTERING BY SWITCHING

[75] Inventor: Michel Gignoux, St. Paul de Varces, France

[73] Assignee: Commissariat A l'Energie Atomique, Paris, France

[21] Appl. No.: 163,793

[22] Filed: Jun. 27, 1980

[30] Foreign Application Priority Data

Jun. 29, 1979 [FR] France .............................. 79 16913

[51] Int. Cl.$^3$ ............................................ H03H 19/00
[52] U.S. Cl. .................................... 333/173; 328/151; 333/172
[58] Field of Search ............... 333/167, 172, 173, 174; 328/151, 167; 364/724

[56] References Cited

U.S. PATENT DOCUMENTS 3,531,741 9/1970 Langer ................................. 333/173
3,613,030 10/1971 Fjallbrant ........................... 333/173

FOREIGN PATENT DOCUMENTS 2294588 7/1976 France .
1254223 11/1971 United Kingdom .

OTHER PUBLICATIONS

Borelli–"Commutated Networks Employing Feedback Circuits", IEEE Trans. on Aerospace and Electronic Systems, vol. AES5, No. 1, Jan. 1969, pp. 39-35.

Primary Examiner—Marvin L. Nussbaum
Attorney, Agent, or Firm—Michael N. Meller; Anthony H. Handal

[57] ABSTRACT

The present invention relates to an assembly for filtering by switching, comprising at least one filter with switched paths and means for applying to each of the filters signals for controlling switching of the paths, said assembly further comprising means for memorizing the output signal of the filter and a mixer circuit whose input receives at a given instant the signal to be filtered; a second input receives at this instant the memorized value which the output signal had, an instant earlier, separated from the instant in question by a whole number of periods of the useful component of the input signal. The invention is applicable to harmonic analysis, telecommunications, filtering of composite signals.

11 Claims, 8 Drawing Figures

ASSEMBLY FOR FILTERING BY SWITCHING

The present invention relates to an assembly for filtering by switching, using series-type filters, with "switched paths", of passband type; this invention is applied to the filtering of a signal presenting a useful component of variable frequency, associated with a considerable background noise; it is also applied to the selection of a periodic signal mixed with another signal, to harmonic analysis, telecommunications, etc.

It is known that very selective pass-band filters may be very easily made by using so-called structures with N switched paths each comprising a resistor associated with a capacitor and two switches; as will be seen hereinafter in detail, these structures may be reduced to one equivalent circuit with N paths in which each path comprises only one capacitor associated with two switches, whilst all the paths present a common input resistor. This equivalent circuit is often qualified as "filter with N paths, of series type, with capacitor switching".

The main advantage of this type of filter is that it presents a "comb" response, presents a band of adjustable width and is tunable in frequency due to the pulses of an outer clock. This latter property makes it possible, in micro-electronics, to produce filters whose structure is integratable. The standard filters of outer frequency are less sensitive than the other filters to the variations of the values of the elements which constitute them; the outer adjustment of their tuning frequency as well as their synchronisation by an outer signal are made simply. The central frequency of the main point of the response curve of these comb filters is defined by the frequency $H_1$ of the outer clock, whilst the width of this main point at $-3$ decibels remains constant whatever the frequency $H_1$. This width may be defined by the relation $B = 1/\pi NRC$ in which N represents the number of paths, R the resistance common to all the paths and C the capacitance resulting from each of the paths. This relation clearly shows that the obtaining of a very narrow pass band with a filter of this type requires that the product NRC be large. In micro-electronics, it is easy to increase the number N of the paths of the filter, but, unfortunately, this increase means that a large space is taken up, which is a major drawback as this space is precious in integrated semiconductor technology. Moreover, the increase in the number of paths of a comb filter simultaneously leads to increasing the frequency of the outer control clock, which, for a given technology, may end up limiting the high frequency of the filter. It is also possible, in order to reduce the width of the pass band, to increase the value of the resistor common to all the paths; in known manner, this resistor may be replaced by switched capacitors. This technique necessitates the use of a second clock delivering pulses of frequency $H_2$, but enables very high values of the resistor to be obtained. However, as the obtaining of a resistor of high value is possible only for low switching frequencies, the application of the Shannon theorem shows that the use of this technique may limit the high frequency of the signal to be filtered. Finally, the resistor thus synthesized, in the form of switched capacitors, being proportional to the switching time, the high frequency of the filter also risks being limited. Another drawback of this technique results from the fact that the switched capacitors present a fairly considerable lack of precision, this naturally risking causing a lack of precision in the width of the pass band of the filter in question.

It follows from these observations that a filter with periodic switching of capacitors is generally bulky, difficult to integrate in microelectronics and has a pass band whose fineness is limited by the frequency of the switching signals.

It is an object of the present invention to remedy these drawbacks and in particular to provide a filtering assembly in which the obtaining of a very narrow pass band does not necessitate an undesirable increase in the number of paths of the switching filters used and for which it is possible to use a resistor common to the different paths, synthesized in the form of switched capacitors, without the application of the Shannon theorem excessively limiting the high frequency of this filtering assembly.

The present invention relates to an assembly for filtering by switching, comprising at least two series-type filters with switched paths, the output of the first filter being connected to the input of the second filter, and means for applying to each of the filters signals for controlling the switchings of the paths, characterized in that said assembly further comprises a mixer circuit of which a first input receives the signal to be filtered and of which a second input is connected to the output of the second or last filter.

According to an advantageous feature of the invention, the path switching control means of the filters are constituted so as to control the switchings for the sum of the time shifts between the output signal and the input signal of each filter is equal to a whole number of periods T of the useful component of the input signal of the first filter.

Under these conditions, the amplitude of the filtered output signal will be maximum; however, it is clear that, if the time shaft is not strictly equal to a whole number of periods, the filtering assembly still functions, only the amplitude of the output signal being decreased.

According to another feature, the two filters comprise an identical number N of paths, each of said shifts being equal to a whole number of half-periods $T/2$ of the useful component of the input signal of the first filter.

According to a first embodiment of the invention, the mixer circuit comprises a non-inverter operational amplifier whose output is connected to the input of the first filter, this amplifier presenting a negative feedback circuit on one of its inputs, the other input of this amplifier receiving the signal to be filtered via a first resistor, this input being further connected to the output of the second filter via a second resistor, the ratio of the values of these resistors determining the weight coefficient of the output signal of the mixer, in the correlation of the input signals.

According to a second embodiment of the invention, the mixer is a switch with two electrically controllable positions, presenting two input terminals and one output terminal, this output terminal being connected to the input of the first filter, the first input terminal of the switch receiving the signal to be filtered and the other input terminal receiving the output signal of the second filter, this switch being controlled by switch control means constituted so as to place the input of the first filter in communication with the output of the second filter.

In this case, the switching of the two-position switch may be controlled at a high frequency (10 times more for example) with respect to the switching frequency of the paths of the filter.

The same clock may also be used for controlling the switch and the two switching filters; in this case, the switching control means of the switch are such that the input of the first filter is placed in communication with the output of the second filter during a time interval centered on the centre of the time interval during which one of the N paths of each of the switching filters is established.

In both cases, the relative duration of the times spent on the two positions determines the weight coefficient of the mixture.

According to a further feature of the second variant, the first input terminal of the two-position switch receives the signal to be filtered via a first resistor whilst the second input terminal receives the output signal of the second filter via a second resistor, the ratio of the values of these resistors also determining the weight coefficient of the output signal of the mixer in the correlation of the input signals.

According to a further feature, the assembly formed by the two position switch and by the first and second resistors is simulated by periodically switched capacitors.

According to another feature, the filters and mixer are made in the form of integrated circuits on semi-conductor substrate.

Finally, according to a further feature, said integrated circuits are MOS type circuits.

The invention will be more readily understood on reading the following description with reference to the accompanying drawings, in which:

FIG. 1 shows:

at (a) a switching filter with N paths, of series type, known in the state of the art and used in the filtering assembly of the invention;

at (b) an equivalent filter of the preceding switching filter of series-type.

Figure 2:
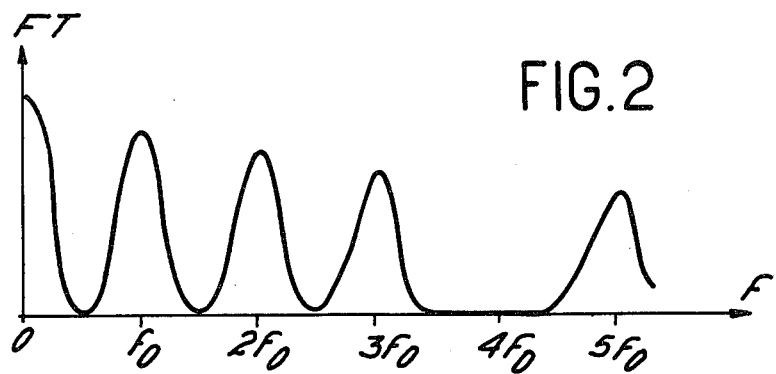
Figure 3:
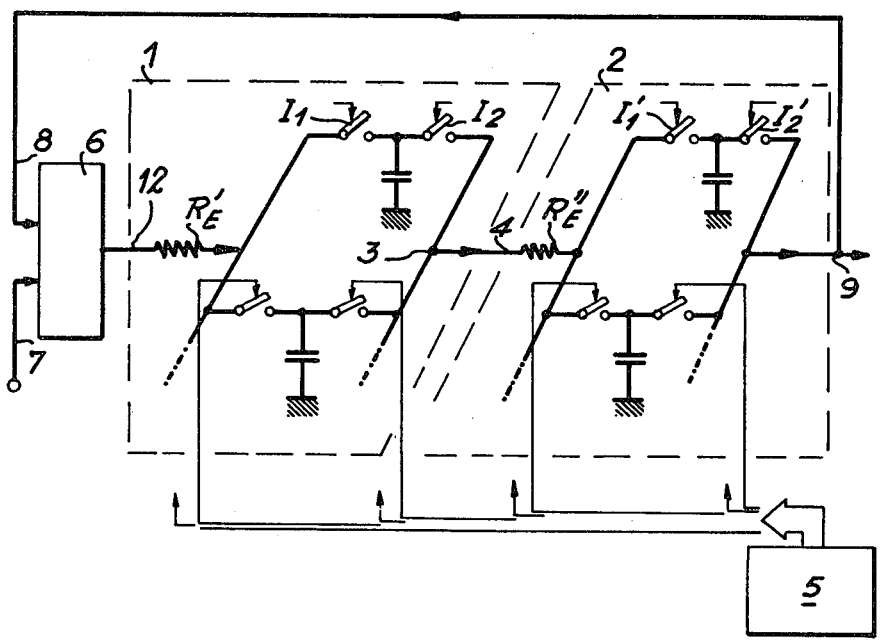
Figure 4:
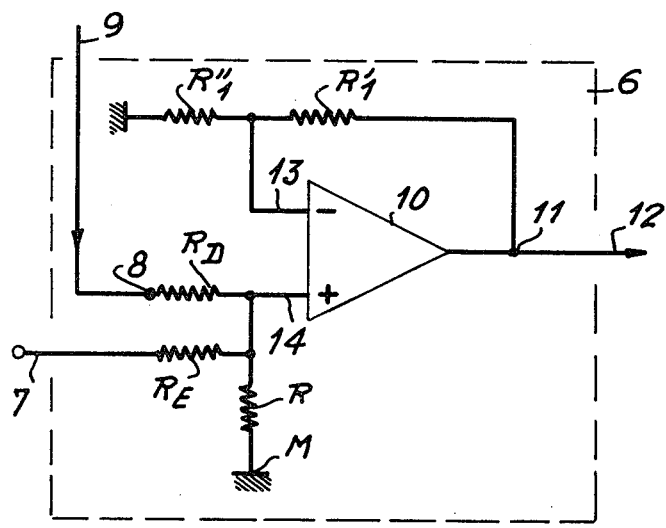
Figure 5:
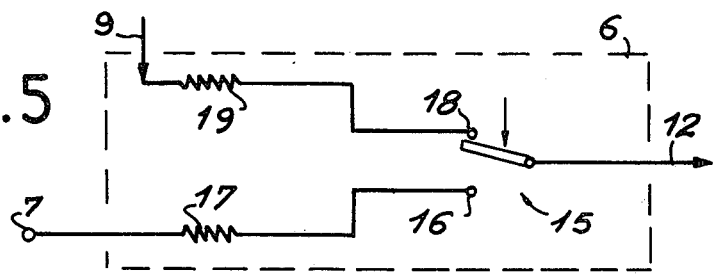
Figure 6:
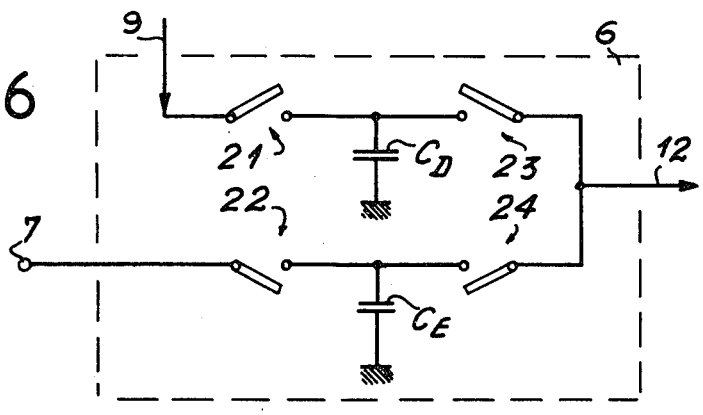
Figure 7:
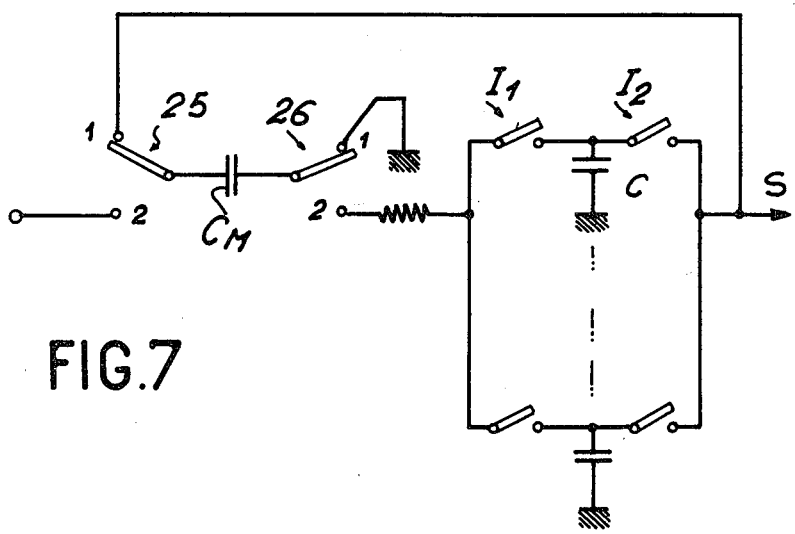

FIG. 2 is a diagram illustrating the transfer function $F_T$ of one of the preceding filters, as a function of the frequency F of the signal at the input of this filter;

FIG. 3 schematically shows a filtering assembly according to the invention;

FIG. 4 schematically shows an embodiment of the mixer which is employed in the filtering assembly of the invention;

FIG. 5 schematically shows another embodiment of this mixer;

FIG. 6 schematically shows another embodiment of the mixer of FIG. 5;

FIG. 7 shows another embodiment of the filter, including memory capacity.

Referring now to the drawings, FIG. 1 shows at (o) a series-type switching filter with N paths, known in the state of the art and used, as will be seen hereinafter, in the filtering assembly of the invention.

This filter comprises an input resistor $R_e$ connected in series with N filter cells present respectively on N paths switchable via controllable switches such as $I_1$, $I_2$. Each filter cell, in the embodiment shown, is constituted by a resistor R associated with a capacitor C of which one of the terminals is taken to a reference potential B. The input signal to be filtered is applied to the input E of the filter, whilst the filtered output signal is obtained at S. This type of switching filter of series type, known in the state of the art, may be qualified as switching filter with N paths sampled repetitively; it is very selective and functions by taking part of the input signal successively from the N paths disposed across the passage of this signal. The filter cells of the different paths are generally identical and the instants when the signal is taken from each path are regularly distributed in time and do not intersect when there is passage from one path to the following, in cyclic manner. This figure does not shown the known means which make it possible to control the switches $I_1$, $I_2$ in cyclic manner; these means may be constitued by logic circuits, whilst the controllable switches $I_1$, $I_2$ may be constituted by field effect transistors. As the N paths are cyclically switched and succeed one another across the passage of the signal, the response of the filter is not independent of time. If the time constant of each filter cell of each path is large with respect to the switching time, the resultant transfer function is symmetrical with respect to the switching frequency. If the sinusoidal signal applied to the input of the filter presents a fundamental component of frequency $f_0$, at each period, each capacitor C is affected by the value of the signal which returns thereto in the course of the cycle. This value does not change if the switching is synchronous of the fundamental component of the input signal. Each capacitor is charged during the time interval which is given thereto during the switchings and this charge is maintained for the rest of the time. At established rate, each capacitor rejoins the value of the signal by which it is affected. At the output of the filter, the signal obtained is a shape close to the input signal, by discrete, regularly distributed values. The features of the pass band filter thus produced and shown in the figure are determined by the elements of the low pass filter constituted by each cell of each path. The selectivity or the pass band of this filter with N switched paths depends, of course, on the number N. The effect of sampling on the low-pass filter cells of each path in fact produces, not one low-pass response centred on the fundamental frequency $f_0$ of the input signal, but a whole series of bands centred on the harmonics of the frequency $f_0$ and on frequency 0.

As will be seen hereinafter, the general form of the response of this switching filter with N paths is characteristic of the sampling. In particular, if N is the number of paths, the system has a zero response for frequencies $Nf_0$, $2Nf_0$, etc . . . ; it is for this reason that these filters are often called "comb filters" and that "points" of the comb designate the lines centred on the frequencies $f_0$, $2f_0$, etc.

Part (b) of FIG. 1 shows an equivalent diagram of the preceding switching filter of "series" type. In this equivalent diagram, the input resistor $R'_e$ is the resistor equivalent to the input resistor $R_e$ and to the resistor R of each of the paths; the equivalent filter thus obtained is indeed a filter of "series" type, since the gates or sampling switches $I_1$ and $I_2$ are disposed between the input E and the output F of the signal. The main advantage of this arrangement is to place the passage resistors of the switches $I_1$ and $I_2$ of each path in series with the purely resistive element $R'_e$ and to conserve for the element C its purely reactive character. The switches $I_1$ and $I_2$ may be actuated either simultaneously or with a certain fixed time shift. This then results in a fixed phase-shift at the output; only this arrangement of "series" type allows this phase-shift. As will be seen hereinafter in detail, the resistor $R'_e$ may be synthesized in the form of switched capacitors.

The series-type switching filter with a N paths which has just been described in FIGS. 1a and 1b may be qualified as comb filter; it may easily be converted into switching filter of N paths, of pass-band type, when it is followed by a coarse pass band filter sufficient to promote only one of the lines of the comb.

Referring to FIG. 2, a diagram has been shown, illustrating the transfer function $F_T$ of one of the preceding filters, as a function of the frequency f of the signal arriving at the input of this filter. As has been explained hereinbefore, the filters described in the preceding figures are so called "comb" pass-band filters, for which the resultant transfer function is symmetrical with respect to the switching frequency $f_0$. One of the original features of these filters is that, if the switching frequency $f_0$ is changed, the central frequency of the pass-band filter with N switched paths is changed, without changing the width of the band. However, as has already been indicated, the name of comb filter comes from the fact that the sampling produces, not a single pass-band response centred on $f_0$, but a whole series of bands centred on the harmonics of $f_0$ and the frequency 0, as shown in FIG. 2. The transfer function shown in FIG. 2 is characteristic of a sampled filter with four paths. The points of the comb designate the lines in $f_0$, $2f_0$, etc. The relative duration of the samplings is not critical. It is the sum of the durations of these samples which must be strictly equal to the period $T_0$ of the fundamental of the input signal, on penalty of enlarging the line at frequency $f_0$.

FIG. 3 schematically shows an assembly for filtering by switching according to the invention and comprising at least two series-type filters 1, 2 with switched paths; each of these filters, which is not shown in detail in the figure, presents an equivalent structure comparable with that of the equivalent filter shown in FIG. 1(b). The output 3 of the first filter is connected to the input 4 of the second filter and means 5 enable signals controlling the switchings of the paths of each filter to be applied to each of these filters and particularly to the switches $I_1$ and $I_2$, shown in FIG. 1. This filter assembly further comprises a mixer circuit 6 which will be described in detail hereinafter and of which a first input 7 receives the signal to be filtered whilst a second input 8 is connected to the output 9 of the second filter 2; this output 9 also constitutes the output of the filter assembly. The switches which allow the switching of the paths, under the control of means 5, are shown at $I_1$, $I_2$ for filter 1, whilst they are shown at $I'_1$, $I'_2$ for filter 2. The resistors common to all the paths are referenced $R'_E$ and $R''_E$ for each of the filters 1, 2. Thus, as will be seen, the filtering assembly according to the invention using two series-type switching filters, connected in series and associated with a mixer, necessitates, in order suitably to improve the coefficient of excess voltage of the filtering, time shifts between the two input signals of the mixer; these shifts may attain one or more periods of the input signals. The description of the functioning of the filter 1 will now enable it to be more readily understood how this time shift of one or more periods may be effected. This description of the functioning of the filter 1 is of course applicable to the functioning of the filter 2. The series-type filter 1, shown in the figure may for example comprise N paths. Each of these paths comprises, on either side of the filtering capacitor C, switches $I_1$ and $I_2$, qualified respectively as read-in and read-out switches. The input switches $I_1$ are closed successively at a rate T and each of them remains closed during a time $\theta$; this time $\theta$ during which each of the switches remains on a position which renders it conductive, must be shorter than the time T which separates the selection of two successive paths, for there not to be any overlap in the sampling of the signals reaching the input 7 of the filtering assembly. Thus, the input signal is switched through the mixer 6 towards one of the N paths of the filter 1; It is obvious that the signal filtered at the output 3 of the filter 1 undergoes a comparable sampling in the filter 2. The switches $I_1$ are qualified as read-in switches since they allow the memorizing of a sample of an input signal, in each of the capacitors C of the paths of the filter. The switches $I_2$ located on the output 3 side of the filter, after the capacitors C, may be qualified as read-out switches; these switches are actuated in the same manner and at the same rate T as the switches $I_1$ and they make it possible to place each of the capacitors C in communication with the output of the filter, in synchronism with the closure of the switches $I_1$, for the same duration of closure $\theta$. The switches $I_2$, qualified as read-out switches, whilst remaining actuated at the same rate T, might be controlled by the control means 5, so as to place each of the capacitors of the paths of the filter in communication with the output of this filter, during a time interval always equal to $\theta$, but with a time shift between the closure of the switches $I_1$ and the closure of the switches $I_2$. This may be effected when the switches $I_1$ and $I_2$ are actuated by the same clock signals coming from the control means 5, but in a different order. This order may in particular introduce a constant time shift in the control signals closing the switches $I_1$, $I_2$; this time shift preferably corresponds to a multiple of the rate T at which the input switches are closed. In fact, the control signals of the output switches are shifted in time by a whole number of time intervals T, of between 1 and N-1, with respect to the signals controlling the input switches. When this shift or this delay between the signals controlling the output switches and the input switches is fixed at N/2 . T, the time shift between the output signal of the filter and the input signal is equal to a half-period of this input signal. If this signal is sinusoidal, this time shift corresponds to a phase shift of 180° between the output signal and the input signal of the filter. This reasoning is of course applicable to the filter 2. However, as has just been seen, it is impossible, with the filter 1 alone, to effect a shift or delay greater than $(N-1).T$. In fact, a delay greater than NT may be written in the form $(n+kN)T$ and this results, after k periods of the input signal, in the delay introduced between the output signal and the input signal being equal to nT, with $1 < n < N-1$. In these relations, N of course designates a whole number corresponding to the number of paths of the filter 1 in question and n also designates a whole number. It follows from these observations that it is impossible to effect a delay of a whole period of the input signal, with one switching filter with N paths. The filtering assembly of the invention which associates a switching filter 2 with the filter 1 described previously, makes it possible to effect this shift by a period between the filtered signal and the input signal. When the two filters 1 and 2 each shift by a half-period the signal that they receive at their input, the output signal of the filtering assembly is shifted by one period with respect to the input signal. With this arrangement, the signal at the present instant is found at the input, simultaneously to the signal which was produced at the preceding period, which is found at the output. As the output 9 of the second filter 2 is relooped on the input 8 of the mixer 6, this results in the filtering assembly obtained being similar to a filter of the recursive type; this filtering assembly presents a weight coefficient introduced by the mixer 6 in the correlation of the signals that the latter receives on its inputs. The selectivity and therefore the response time of the filtering assembly according to the invention depend on this weight coefficient. If the mixture of the input and output signals of the filter is such that the proportion of the output signal, in this mixture, is zero, the filter acts as a filter with N paths, equivalent to two filters with N paths connected in series. Of course, it is assumed in this case that the filters 1 and 2 are identical and comprise the same number N of paths. If, on the contrary, the mixer 6 allows a progressively larger proportion of the delayed output signal, with respect to the direct input signal, the response of the filtering assembly tends towards infinity. The invention therefore enables the selectivity of the starting switching filter to be increased as desired and in large proportions, due to its association with a second switching filter. One example may be given: two filters with 16 paths are used, which are identical and of measured time constant of 1.6 second: they are associated according to the invention using a two-position switch of equal durations and respecting the condition of centering of the switchings of the switch and establishment of the paths, expressed on page 4; a filtering assembly is then obtained whose measured time constant is 160 seconds.

In the filtering assembly which has just been described, the two filters 1 and 2 are assumed to be identical and controlled at the same rate by signals controlling the closure of the switches of the said duration; these switches are, moreover, controlled in the same order, but with a time shift equal to a half-period of the fundamental input signal. Finally, the central frequencies of the two filters 1 and 2 are identical. However, in another embodiment, the sum of the shifts introduced by each of the filters may be equivalent to a whole number of periods of the signal received at the input of the filtering assembly, without the two switching filters of series type presenting the same number of switches or the same time response; in fact, these two filters must be simply centred on the same frequency. It is simply more practical to use only two series-type switching filters, which present the same number N of switches. In the following specification, it will be assumed that the two filters are identical, so as to facilitate understanding of the functioning of the filtering assembly of the invention.

FIG. 4 schematically shows a first embodiment of the mixer 6. In this first embodiment, the mixer 6 comprises a non-inverter operational amplifier 10, whose output 11 is connected to the input 12 of the filter 1. This operational amplifier presents a negative feedback circuit on one of its inputs 13; this negative feedback circuit is constituted in known manner by two resistors $R'_1$ and $R''_1$. The other input 14 of the operational amplifier receives the signal to be filtered at 7, via a resistor $R_E$, whilst the signal of the output 9 of the filtering assembly is received on the input 14, via a second resistor $R_D$. A resistor R connects the input 14 of the operational amplifier 10 to a reference mass M, in known manner.

If S designates the mean amplitude of the output signal of the filtering assembly, S' the mean amplitude of the output signal of the operational amplifier 10, E the mean amplitude of the input signal of the filtering assembly, it is possible to write, in known manner:

$$S' = \frac{E \cdot R}{R_E + R} + \frac{S \cdot R}{R_D + R}$$

This relation shows that the weight coefficient of the mixer thus constituted corresponds to the ratio of the input resistors $R_E$ and $R_D$ of the operational amplifier 10.

FIG. 5 schematically shows another embodiment of the mixer 6. According to this further embodiment, the mixer is constituted by a switch 15 with two positions electrically controllable from control signals coming for example from control means 5 (FIG. 1). This switch may be constituted by an assembly comprising filed effect transistors. The first terminal 16 of this switch receives the signal to be filtered, via a resistor 17 for example, whilst the second terminal 18 of this switch receives the signal of the output 9 of the second filter, via a second resistor 19. The output terminal 20 of the switch is connected to the input 12 of the first filter 1. In this other embodiment of the mixer 6, the weight of the output signal of the mixer in the correlation of the signals that it receives on these inputs is determined by adjusting the relative time spent on one or the other of the switching positions. If the switching position 18 is maintained longer than the switching position 16, there is in the output signal of the mixer a preponderance of the signal delayed with respect to the input signal; this results in that the response time of the filtering assembly is increased. If, on the contrary, the switch remains longer in position 16 than in position 18, there is preponderance of the input signal in the output signal of the filtering assembly. In a limiting case, if the switch 15 remains constantly on position 18, the filtering assembly behaves as an infinite memory (apart from the technological imperfections), whilst if the switch is maintained constantly in position 16, the filtering assembly behaves as two series-type switching filters connected in series. The resistors 17 and 19 are not compulsory in this embodiment of the mixer, but they may serve to modify the weight coefficient introduced by this mixer in the correlation of the input signals.

FIG. 6 shows another embodiment of the mixer 6 for which the resistors 17 and 19 of the mixer of FIG. 5 are simulated by capacitors $C_D$ and $C_E$, switched periodically due to switches 21, 22, 23, 24; these switches also act as the two-position switch 15 of FIG. 5. The switches 21, 23 and capacitor $C_D$ constitute a circuit equivalent to the resistor 19, whilst the switches 22,24 and the capacitor $C_E$ constitute a circuit equivalent to resistor 17. The switches 21, 23 are actuated alternately, without overlap of their duration of closure. The same applies to the switches 22 and 24. The duration of closure of the switches 21 and 22 makes it possible to adjust the value of the corresponding equivalent resistor.

It follows from this embodiment of the mixer of the filtering assembly of the invention that all the resistors, and particularly resistors $R'_E$ and $R''_E$ common to all the paths of each of the filters of the filtering assembly, may be simulated by capacitors and switches; thus, the filtering assembly presents a structure constituted solely by switches and capacitors which, in MOS technology, are particularly easy to integrate. The switches may of course be constituted by field effect transistors. The filtering assembly of the invention, due to the use of two series type switching filters and an appropriate mixer, may be constituted very easily by integratable discrete elements. In fact, by using for the resistors an equivalent circuit comparable to the circuit of FIG. 6 (switched capacitors), the filtering assembly is reduced to an association of components of two types: capacitors and field effect transistors. The precise adjustment of the central frequency and of the width of the pass band may be very easily effected from one or more outer clocks; this width may be adjusted either by acting on the weight coefficient introduced by the mixer, or by acting on the width of the pass band of each of the filters of the assembly by adjusting the values of the resistors that they comprise.

The filtering assembly which has just been described, whilst considerably and adjustably increasing the selectivity of the filter with switched paths, conserves the properties thereof: it is highly insensitive to the values of the elements which compose it; it presents a broad range of values of central frequency and of band width, a phase response passing through 0 at the central frequency; it responds to periodic signals and its transfer function, in comb point form, presents a symmetry about each of the points of this comb, on a linear frequency axis. It is obvious that this filtering assembly may further be associated with any means allowing the tracking in frequency of the input signal and, in particular, with the means described in Applicants Patent Application No. 79 02 752 filed Feb. 2, 1979.

This filtering assembly further makes it possible to eliminate the background noise associated with any periodic signal, to select a periodic signal mixed with another signal, to recognize a wave form variable in frequency; it may be easily used in speech synthesis, telecommunications, telephony, etc. It may also enable the industrial parasites at 50, 60 or 400 Hz, the parasites created by the functioning of rotary machines at variable frequency, to be eliminated; finally, it may be used in harmonic analysis and synchronous detection.

The invention is not limited to the general diagram of FIG. 3, which employs two filters with switched paths; it covers all the filtering assemblies using a filter with switched paths, means for memorizing the signal contained in one of the paths during a time interval equal or close to the period of the useful signal (or a multiple of this period), and a mixer circuit whose first input receives the signal to be filtered and a second input is connected to the output of said means, said mixer circuit thus effecting a comparison between the instantaneous value of the signal and the value which the signal had, one period of the useful signal (or the same multiple of this period) beforehand.

A first example of such a filtering assembly uses a filter with switched paths, switching control means such as the time shift between input signal and output signal of this filter, is equal to a half-period of the useful component of the input signal and a mixer circuit receiving on an inverter input the output signal of the filter with switched paths and on a non-inverter input the signal to be filtered.

This circuit, more economical than the preceding one, gives equivalent results only for the useful signals on which the inversion produces the same effect as the shift by a half-period. For the other useful signals, it gives a filtered signal presenting a distorsion and may be used as balancer.

A second example uses a filter with switched paths, switching control means, such that there is no time shift between input signal E and output signal S, a memory capacitor CM and a set of two switches 25, 26 connected in accordance with the diagram of FIG. 7; in a first position of the set of switches (position 1), the signal stored in one of the paths of the filter is introduced into the memory capacitor; in a second position (position 2), the input signal is compared with the memorized signal (corresponding to a sampling effected substantially one period earlier), and modifies the value of the signal stored in the same path.

The circuit according to this second example involves no limitation on the input signals.

What is claimed is:

1. An assembly for filtering permanent useful signals by switching, comprising:

(a) at least one filter, said filter having an input and an output a plurality of switched filtering paths said switched filtering paths having inputs and outputs, the inputs of said switched filtering paths being connected to the input of said filter and the outputs of said filtering paths being connected to the output of said filter, each of said filtering paths having a characteristic which causes its output to be delayed with respect to its input;

(b) means for applying to each of the filtering paths switching control signals to selectively actuate said filtering paths;

(c) means for memorizing the value of the output signal of said filter said memorizing means being associated with each of said switched filtering paths; and (d) a mixer circuit having a first input which receives at a given instant in time the signal to be filtered and a second input which receives at said given instant said memorized value which said output signal had, at a point in time an interval in time earlier, said point in time separated from said given instant by substantially a whole number of periods of the useful component of the input signal, and said mixer circuit correlating signals provided to the first and second inputs.

2. The assembly for filtering by switching of claim 1, comprising at least two series-type filters with switched paths, the output of the first filter being connected to the input of the second filter, means for applying to each of the filters signals for controlling the switchings of the paths, and a mixer circuit having a first input which receives the signal to be filtered and having a second input which is connected to the output of the second or last filter, the path switching control means of the filters being constituted so as to control the switchings for the sum of the time shifts between the output signal and the input signal of each filter to be equal to a whole number of periods T of the useful component of the input signal of the first filter.

3. The filtering assembly of claim 2, wherein the two filters comprise an identical number N of paths, each of said shifts being equal to a whole number of half-periods T/2 of the useful component of the input signal of the first filter.

4. The filtering assembly of claim 2, wherein said mixer circuit comprises a non-inverting operational amplifier whose output is connected to the input of the first filter, this amplifier presenting a negative feedback circuit on one of its inputs, the other input of this amplifier receiving the signal to be filtered via a first resistor, this input being further connected to the output of the second filter via a second resistor, the ratio of the values of these resistors determining the weight coefficient of the mixer.

5. The filtering assembly of claim 2, wherein the mixer is a switch with two electrically controllable positions having two input terminals and one output terminal, this output terminal being connected to the input of the first filter, the first input terminal of the switch receiving the signal to be filtered and the other input terminal receiving the output signal of the second filter, the relative duration of the times spent on the two positions determining the weight coefficient of the mixer.

6. The filtering assembly of claim 5, wherein the two switching filters are controlled by the same control means and the switch is controlled by switching control means constituted so as to place the input of the first filter in communication with the output of the second filter during a period centred on the centre of the time interval during which one of the paths of each of the filters is established.

7. The filtering assembly of claim 5, wherein the first input terminal of the two-position switch receives the signal to be filtered via a first resistor whilst the second input terminal receives the output signal of the second filter via a second resistor, the ratio of the values of these resistors determining the weight coefficient of the output signal of the mixer in the correlation of the input signals.

8. The filtering assembly of claim 5, wherein the assembly formed by the two-position switch and by the first and second resistors is simulated by periodically switched capacitors.

9. The filtering assembly of claim 1, wherein the filters and the mixer are in the form of integrated circuits on semiconductor substrate.

10. The filtering assembly of claim 9, wherein said integrated circuits are MOS type circuits.

11. An assembly as in claims 1, 2 or 3, wherein only one of said plurality of filter paths in a single filter is actuated at any given point in time.

* * * * *